(12) United States Patent
Seo et al.

(10) Patent No.: US 11,501,829 B2
(45) Date of Patent: *Nov. 15, 2022

(54) RESISTIVE RANDOM-ACCESS MEMORY FOR EMBEDDED COMPUTATION

(71) Applicant: Arizona Board of Regents on behalf of Arizona State University, Scottsdale, AZ (US)

(72) Inventors: Jae-sun Seo, Tempe, AZ (US); Shimeng Yu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/921,198

(22) Filed: Jul. 6, 2020

(65) Prior Publication Data

US 2021/0082502 A1 Mar. 18, 2021

Related U.S. Application Data

(63) Continuation of application No. 16/126,563, filed on Sep. 10, 2018, now Pat. No. 10,706,923.

(Continued)

(51) Int. Cl.
*G11C 7/22* (2006.01)
*G11C 13/00* (2006.01)
(Continued)

(52) U.S. Cl.
CPC ............ *G11C 13/004* (2013.01); *G06N 3/02* (2013.01); *G11C 7/1006* (2013.01); *G11C 7/18* (2013.01);
(Continued)

(58) Field of Classification Search
CPC ..... G11C 13/0002; G11C 13/004; G06N 3/02
See application file for complete search history.

(56) References Cited

U.S. PATENT DOCUMENTS 6,034,887 A * 3/2000 Gupta .................. B82Y 25/00
257/E27.005
8,611,134 B2 12/2013 Carter
(Continued)

FOREIGN PATENT DOCUMENTS

WO WO-2017105514 A1 * 6/2017 ......... G11C 13/0004
WO 2017190089 A1 11/2017
(Continued)

OTHER PUBLICATIONS

Courbariaux, M. et al., "BinaryConnect: Training Deep Neural Networks with binary weights during propagations," Advances in Neural Information Processing Systems 28 (NIPS 2015), Proceedings of the Neural Information Processing Systems Conference (NIPS), Dec. 7-12, 2015, Montreal, Canada, Neural Information Processing Systems Foundation, Inc., 10 pages.
(Continued)

*Primary Examiner* — Mushfique Siddique
(74) *Attorney, Agent, or Firm* — Withrow & Terranova, P.L.L.C.

(57) ABSTRACT

A resistive random-access memory (RRAM) system includes an RRAM cell. The RRAM cell includes a first select line and a second select line, a word line, a bit line, a first resistive memory device, a first switching device, a second resistive memory device, a second switching device, and a comparator. The first resistive memory device is coupled between a first access node and the bit line. The first switching device is coupled between the first select line and the first access node. The second resistive memory device is coupled between a second access node and the bit line. The second switching device is coupled between the second
(Continued)

select line and the second access node. The comparator includes a first input coupled to the bit line, a second input, and an output.

14 Claims, 3 Drawing Sheets

Related U.S. Application Data

(60) Provisional application No. 62/556,157, filed on Sep. 8, 2017.

(51) Int. Cl.
    *G06N 3/02*     (2006.01)
    *G11C 7/18*     (2006.01)
    *G11C 11/54*     (2006.01)
    *G11C 7/10*     (2006.01)

(52) U.S. Cl.
    CPC ............ *G11C 11/54* (2013.01); *G11C 13/003* (2013.01); *G11C 2013/0042* (2013.01); *G11C 2013/0054* (2013.01)

(56) References Cited

U.S. PATENT DOCUMENTS

| | | |
|---|---|---|
| 9,466,362 B2 | 10/2016 | Yu et al. |
| 9,589,615 B2 | 3/2017 | Kulkarni et al. |
| 9,666,259 B1 | 5/2017 | Jung et al. |
| 9,934,463 B2 | 4/2018 | Seo et al. |
| 2008/0084724 A1 | 4/2008 | Nozieres et al. |
| 2009/0003046 A1 | 1/2009 | Nirschl et al. |
| 2015/0356006 A1 | 12/2015 | Pemer |
| 2016/0259676 A1* | 9/2016 | Tomishima ......... G06F 11/1076 |
| 2017/0300815 A1 | 10/2017 | Seo |
| 2017/0364791 A1 | 12/2017 | Miyashita et al. |
| 2018/0144240 A1 | 5/2018 | Garbin et al. |
| 2018/0315473 A1 | 11/2018 | Yu et al. |
| 2019/0056915 A1 | 2/2019 | Jabir et al. |
| 2019/0080755 A1 | 3/2019 | Seo et al. |
| 2019/0087719 A1 | 3/2019 | Seo et al. |
| 2019/0131977 A1 | 5/2019 | Obradovic et al. |
| 2019/0150794 A1 | 5/2019 | Vrushula et al. |
| 2019/0164044 A1* | 5/2019 | Song .................. G11C 16/0408 |
| 2019/0164538 A1 | 5/2019 | Seo et al. |
| 2019/0244100 A1 | 8/2019 | Seo et al. |
| 2019/0280694 A1 | 9/2019 | Obradovic et al. |
| 2020/0098428 A1* | 3/2020 | Gaillardon .......... G06N 3/0454 |

FOREIGN PATENT DOCUMENTS

| | | |
|---|---|---|
| WO | 2018022821 A1 | 2/2018 |
| WO | 2018057749 A1 | 3/2018 |

OTHER PUBLICATIONS

Esser, S. et al., "Backpropagation for Energy-Efficient Neuromorphic Computing," Advances in Neural Information Processing Systems 28 (NIPS 2015), Proceedings of the Neural Information Processing Systems Conference (NIPS), Dec. 7-12, 2015, Montreal, Canada, Neural Information Processing Systems Foundation, Inc., 10 pages.

Rastegari, M. et al., "XNOR-Net: ImageNet Classification Using Binary Convolutional Neural Networks," Proceedings of the 14th European Conference on Computer Vision (ECCV 2016), Part IV, LNCS 9908, Oct. 2016, Amsterdam, The Netherlands, Springer International Publishing AG, pp. 525-542.

Non-Final Office Action for U.S. Appl. No. 16/126,563, dated Oct. 8, 2019, 25 pages.

Notice of Allowance for U.S. Appl. No. 16/126,563, dated Mar. 4, 2020, 9 pages.

\* cited by examiner

RESISTIVE RANDOM-ACCESS MEMORY FOR EMBEDDED COMPUTATION

RELATED APPLICATIONS

This application is a continuation of U.S. patent application Ser. No. 16/126,563, filed Sep. 10, 2018, issued as U.S. Pat. No. 10,706,923, which claims the benefit of provisional patent application Ser. No. 62/556,157, filed Sep. 8, 2017, the disclosures of which are hereby incorporated herein by reference in their entireties.

FIELD OF THE DISCLOSURE

The present disclosure relates to memory architectures for the efficient implementation of deep neural networks.

BACKGROUND

Deep neural networks, and in particular convolutional neural networks, are being used with increasing frequency for a number of tasks such as image classification, image clustering, and object recognition. In a forward propagation of a conventional convolutional neural network, a kernel is passed over one or more tensors to produce one or more feature maps. At a particular location of the kernel within a tensor, each of a number of input values in the tensor operated on by the kernel are multiplied by a corresponding weight value in the kernel and summed via addition and subtraction to produce a single value of a feature map. Accordingly, a conventional convolutional neural network requires multiplication, addition, and subtraction. Implementing a conventional convolutional neural network requires a large amount of computing power, and the technology has thus been unavailable for mobile and low-power devices such as those for the Internet of Things.

Recent work in the field has focused on reducing the necessary computing power for implementing convolutional neural networks. A first approach, referred to as a "binary neural network," uses binary weight values in the kernel. By converting the weight values in the kernel to binary values, a forward propagation of the binary neural network can be computed using only addition and subtraction. Foregoing the need for multiplication during forward propagation may result in a 2× savings in computing power. Further, storing binary weight values instead of real weight values may produce a 32× savings in memory. Finally, using binary weight values results in minimal if any impact on the accuracy of the binary neural network.

An additional approach, referred to as an "XNOR neural network," uses binary input values in the tensors and binary weight values in the kernel. By converting the input values in the tensors and the weight values in the kernel to binary values, a forward propagation of the XNOR neural network can be computed using only an exclusive nor (XNOR) operation and a bit count operation, where a bit count operation is simply a count of the number of high bits in a given stream of binary values. Using an XNOR operation and a bit count operation instead of multiplication, addition, and subtraction may result in a 58× savings in computing power. Further, storing binary input values instead of real input values and binary weight values instead of real weight values may produce a 32× savings in memory. While using binary input values and binary weight values does reduce the accuracy of the XNOR neural network, the results are often still acceptable for use.

XNOR neural networks in particular have opened the possibility of implementation on mobile and other low-power devices. However, conventional computing systems are not well suited for the efficient implementation of these XNOR neural networks. Accordingly, there is a need for computing systems, and in particular memory architectures, capable of efficiently supporting the operation of XNOR neural networks for improvements in speed and efficiency.

SUMMARY

In one embodiment, a resistive random-access memory (RRAM) system includes an RRAM cell. The RRAM cell includes a first select line and a second select line, a word line, a bit line, a first resistive memory device, a first switching device, a second resistive memory device, a second switching device, and a comparator. The first resistive memory device is coupled between a first access node and the bit line. The first switching device is coupled between the first select line and the first access node. The second resistive memory device is coupled between a second access node and the bit line. The second switching device is coupled between the second select line and the second access node. The comparator includes a first input coupled to the bit line, a second input, and an output.

In one embodiment the RRAM system may further include memory control circuitry coupled to the RRAM cell, where the memory control circuitry is configured to set a resistance of the first resistive memory device to represent a binary weight value, set a resistance of the second resistive memory device to represent a complement of the binary weight value, provide a signal representative of a binary input value to the first select line, provide a signal representative of a complement of the binary input value to the second select line, provide a reference signal to the second input of the comparator, and provide an access signal at the word line. In response to the access signal, the first switching device couples the first select line to the first access node and the second switching device couples the second select line to the second access node. A resulting compare signal provided to the first input of the comparator through the first resistive memory device and the second resistive memory device causes the comparator to provide an output signal at the output, which is representative of a binary value that is equal to an exclusive NOR of the binary weight value and the binary input value.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
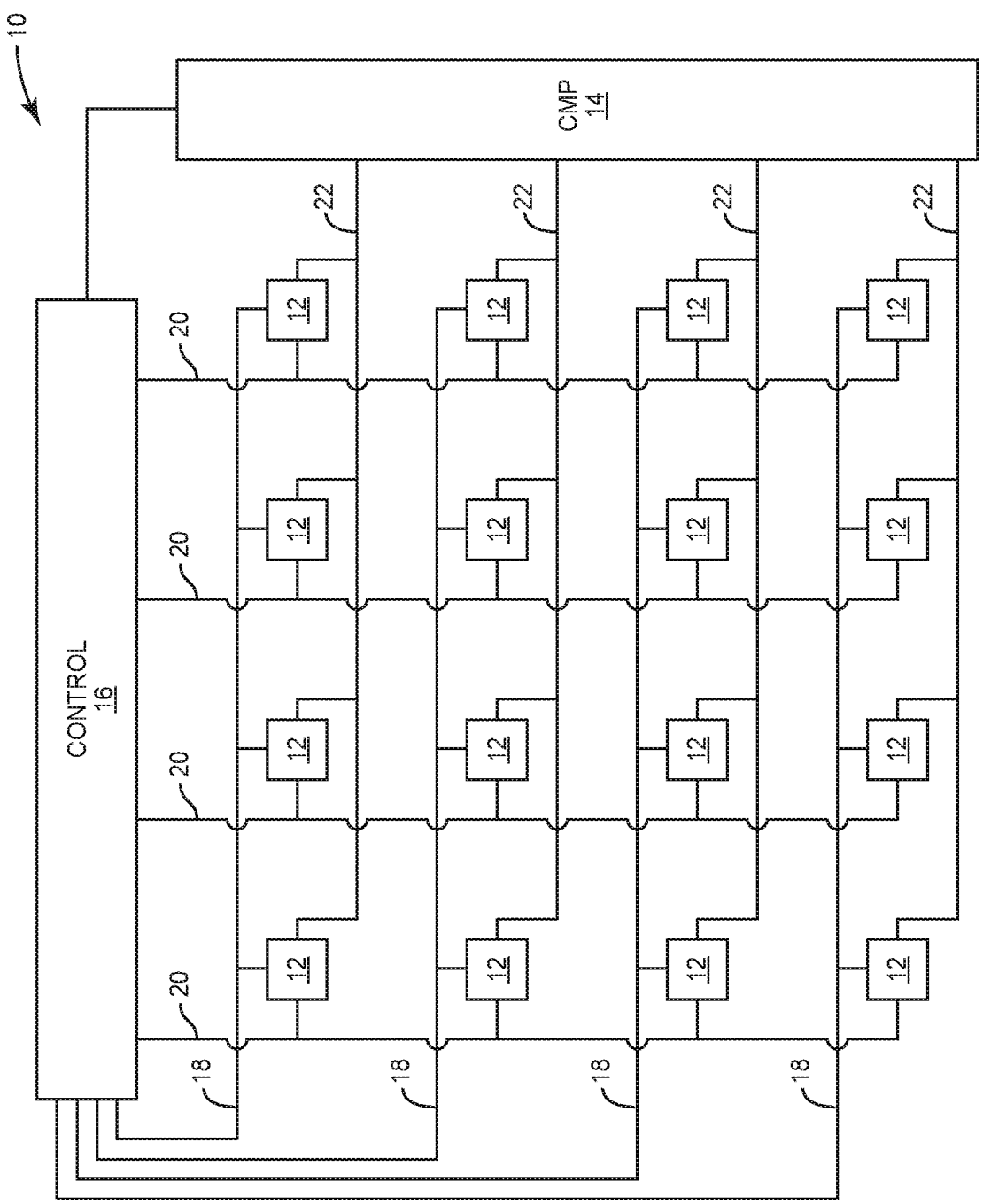
FIG. 1 illustrates a resistive random-access memory (RRAM) system according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a resistive random-access memory (RRAM) memory system 10 according to one embodiment of the present disclosure. The RRAM system 10 includes an array of RRAM units 12, comparator circuitry 14, and memory control circuitry 16. The RRAM units 12 are each coupled between one of a number of word lines 18, one of a number of select lines 20, and one of a number of bit lines 22. The comparator circuitry 14 is coupled between the bit lines 22 and the memory control circuitry 16. The memory control circuitry 16 is coupled to each one of the word lines 18 and the select lines 20. While not shown, the memory control circuitry 16 may further be connected to each one of the bit lines 22 in some embodiments. In operation, the memory control circuitry 16 provides signals to each one of the word lines 18 and the select lines 20 in order to read and write values to and from the RRAM units 12. When reading values from the RRAM units 12 an output indicative of the state of the RRAM units 12 being read is generally provided on the bit line 22.

Notably, while a select number of RRAM units 12 are shown for illustration, those skilled in the art will appreciate that the RRAM memory system 10 may include any number of RRAM units 12 without departing from the principles of the present disclosure. Further, while the memory control circuitry 16 is shown as a single block in FIG. 1, those skilled in the art will appreciate that the memory control circuitry 16 may include multiple discrete parts, each of which is designed to perform a specific portion of the functionality described herein.

In a conventional memory architecture, the comparator circuitry 14 is eliminated and each one of the RRAM units 12 is operated as a memory cell suitable for storing and retrieving a single bit. Such a memory architecture is inefficient, for example, when used for the storage of data associated with an XNOR neural network. In the conventional memory architecture, each one of the input values and weight values must be separately stored in a different RRAM unit 12. Further, the RRAM units 12 must be individually addressed to retrieve the stored contents thereof. Accordingly, only a subset of the RRAM units 12 can be read at a time, which often results in a large number of read operations for each forward propagation of an XNOR neural network. Further, the XNOR operation and the bit count operation must be performed by processing circuitry external to the RRAM system 10, which requires additional read and write operations as the data is provided to and from this external processing circuitry. Due to all of the factors discussed above, conventional memory architectures result in a large amount of inefficiency when used with an XNOR neural network.

Figure 2:
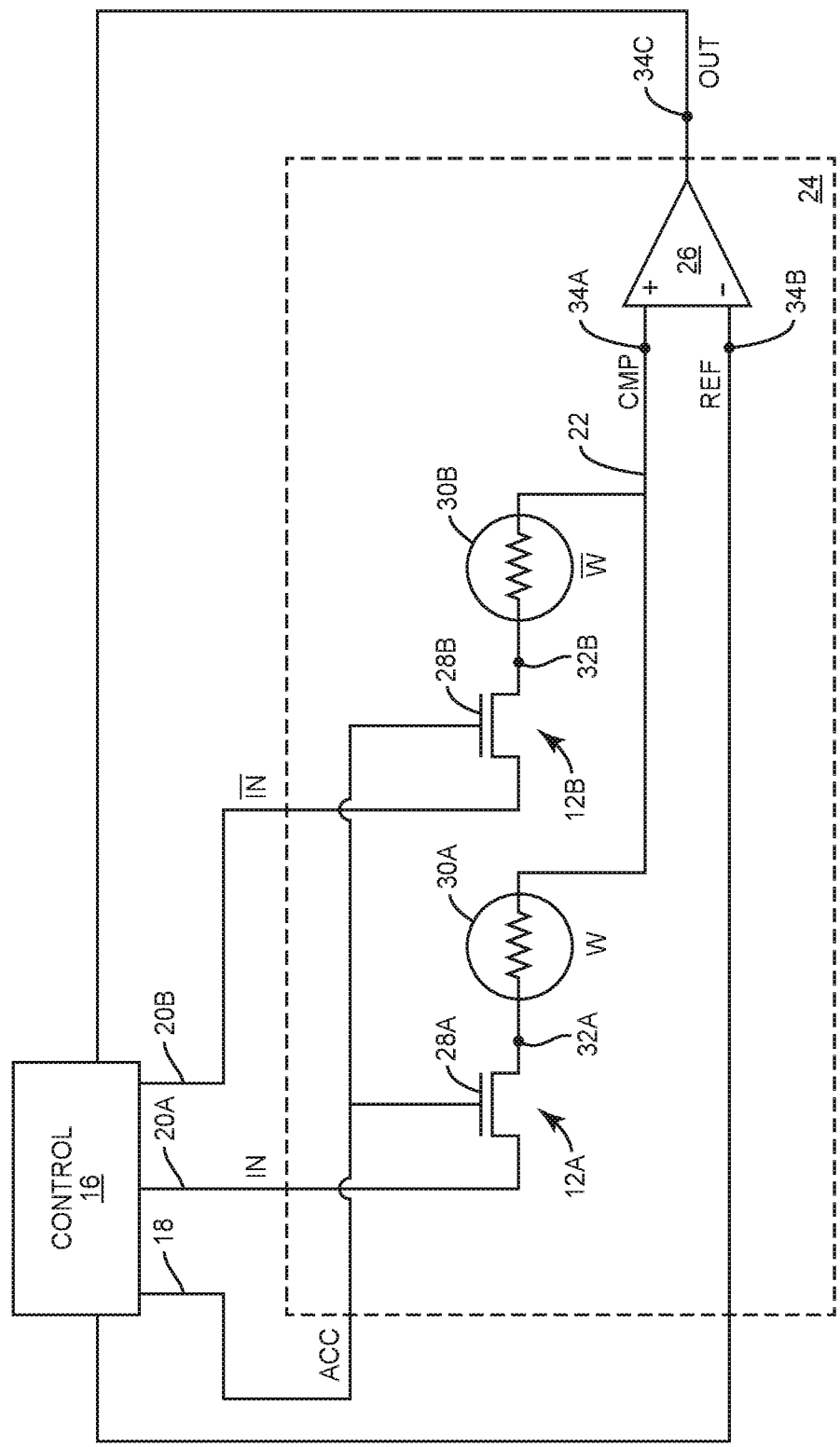
FIG. 2 illustrates an RRAM cell according to one embodiment of the present disclosure.

Accordingly, FIG. 2 shows an RRAM cell 24 according to one embodiment of the present disclosure. The memory control circuitry 16 is shown for context. The RRAM cell 24 includes a first RRAM unit 12A, a second RRAM unit 12B, and a comparator 26 coupled between a word line 18, a first select line 20A, a second select line 20B, and a bit line 22. The first RRAM unit 12A includes a first switching device 28A coupled in series with a first resistive memory device 30A between the first select line 20A and the bit line 22. The first switching device 28A is shown as a transistor including a control input coupled to the word line 18, a first switching input coupled to the first select line 20A, and a second switching input coupled to a first access node 32A, which is in turn coupled to the first resistive memory device 30A. The second RRAM unit 12B includes a second switching device 28B coupled in series with a second resistive memory device 30B between the second select line 20B and the bit line 22. The second switching device 28B is shown as a transistor including a control input coupled to the word line 18, a first switching input coupled to the second select line 20B, and a second switching input coupled to a second access node 32B, which is in turn coupled to the second resistive memory device 30B. The comparator 26 forms a portion of the comparator circuitry 14 and includes a first input 34A coupled to the bit line 22, a second input 34B coupled to the memory control circuitry 16, and an output 34C coupled to the memory control circuitry 16.

The RRAM cell 24 is configured to perform an XNOR operation between a binary input value and a binary weight value. The result of the XNOR operation across multiple RRAM cells 24 may be aggregated with a bit count operation such that a plurality of RRAM cells 24 can be simultaneously read. In operation, the memory control circuitry 16 performs a write operation by setting a resistance of the first resistive memory device 30A to represent a binary weight value (the resistance representing the binary weight value is illustrated as W). In one embodiment, a binary high state (e.g., "1") is represented as a low resistance and a binary low state (e.g., "0," or "−1" in the case of XNOR neural networks wherein binary values are represented as either "1" or "−1") is represented as a high resistance. The memory control circuitry 16 further sets a resistance of the second resistive memory device 30B to represent a complement of the binary weight value (the resistance representing the complement of the binary weight value is illustrated as W). For example, if the binary weight value is a binary high state, the resistance of the first resistive memory device 30A will be set to a low resistance while the resistance of the second resistive memory device 30B will be set to a high resistance, and vice versa. Those skilled in the art will appreciate that resistive memory devices are capable of storing values by changing a resistance thereof between a high resistance value and a low resistance value, and that the particular magnitude of the high resistance and the low resistance as referred to herein depends on the particular design of the resistive memory device. As discussed herein, the high resistance is a resistance that is measurably higher than the low resistance, and in some embodiments the high resistance is at least an order of magnitude larger than the low resistance. For purposes of discussion, it can be assumed that the low resistance state is 0Ω and the high resistance state is ∞Ω.

The memory control circuitry 16 performs a read operation by providing a signal representative of a binary input value (the signal representative of the binary input value is illustrated as IN) to the first select line 20A and providing a signal representative of a complement of the binary input value (the signal representative of the complement of the binary input value is illustrated as IN) to the second select line 20B. For purposes of discussion herein, a binary high state may be represented by a positive voltage (e.g., 2V) while a binary low state may be represented by a zero voltage. Those skilled in the art will appreciate that the particular voltage and/or current levels for representing binary values may be changed without departing from the principles of the present disclosure. The memory control circuitry 16 further provides a reference signal REF to the second input of the comparator 26. Finally, the memory control circuitry 16 provides an access signal ACC at the word line 18. As discussed herein, the access signal ACC is a signal that causes the first switching device 28A to couple (i.e., provide a low resistance path) the first select line 20A to the first access node 32A and the second switching device 28B to couple the second select line 20B to the second access node 32B. When an access signal ACC is not provided the word line 18 is generally kept at a zero voltage (or a voltage below a threshold voltage of the switching devices 28), causing the first switching device 28A to decouple (i.e., provide a high resistance path) the first select line 20A from the first access node 32A and the second switching device 28B to decouple the second select line 20B from the second access node 32B.

When the memory control circuitry 16 performs the read operation as discussed above, a current is produced through the first resistive memory device 30A and the second resistive memory device 30B and combined to form a compare signal CMP at the bit line 22. The current through the first resistive memory device 30A is determined by the voltage of the signal representative of the binary input value IN provided at the first select line 20A and the resistance representative of the binary weight value W at which the first resistive memory device 30A is set. The current through the second resistive memory device 30B is determined by the voltage of the signal representative of the complement of the binary input value IN provided at the second select line 20B and the resistance representative of the complement of the binary weight value W at which the second resistive memory device 30B is set. The combined current through the first resistive memory device 30A and the second resistive memory device 30B is provided as a compare signal CMP to the first input 34A of the comparator 26. The comparator 26 compares the compare signal CMP to the reference signal REF to provide an output signal OUT such that the output signal OUT is representative of a binary value that is equal to an exclusive NOR of the binary weight value and the binary input value.

As an example, when the binary input value and the binary weight value are both binary high states, the first resistive memory device 30A has a low resistance and the second resistive memory device 30B has a high resistance. Further, the signal representative of the binary input value IN at the first select line 20A is a positive voltage while the signal representative of the complement of the binary input value IN at the second select line 20B is a zero voltage. Accordingly, a large current is produced through the first resistive memory device 30A and a zero or negligible current is produced through the second resistive memory device 30B. The resulting compare signal CMP is a large current approximately equal to the current through the first resistive memory device 30A. The reference signal REF is set such that in response to the large current as the compare signal CMP, the comparator 26 provides the output signal OUT as a signal representative of a binary high state. Those skilled in the art will readily understand that the particular magnitude of the large current and the small current are dependent on the resistance of the resistive memory elements 30 as well as the level of the signals used to represent a binary high state in the memory system. In general, the large current is measurably larger than the small current, and in some embodiments the large current is at least an order of magnitude larger than the small current.

As an additional example, when the binary input value is a binary high state and the binary weight value is a binary low state, the first resistive memory device 30A has a high resistance and the second resistive memory device 30B has a low resistance. Further, the signal representative of the binary input value IN at the first select line 20A is a positive voltage while the signal representative of the complement of the binary input value IN at the second select line 20B is a zero voltage. Accordingly, a small current is produced through the first resistive memory device 30A and a zero or negligible current is produced through the second resistive memory device 30B. The resulting compare signal CMP is a small current approximately equal to the current through the first resistive memory device 30A. The reference signal REF is set such that in response to the small current as the compare signal CMP, the comparator 26 provides the output signal as a signal representative of a binary low state.

Those skilled in the art will readily appreciate that when the binary input value is a binary low state and the binary weight value is a binary high state, the output signal OUT will be representative of a binary low state, and when the binary input value is a binary low state and the binary weight value is a binary low state, the output signal OUT will be representative of a binary high state. Accordingly, the RRAM cell 24 is configured to perform an XNOR operation between the binary input value and the binary weight value.

As discussed above, an RRAM cell 24 may be arranged in an array with one or more other RRAM cells 24, wherein each RRAM cell 24 includes two adjacent RRAM units 12 as illustrated in FIG. 1 and a comparator 26. The output signal OUT from every comparator 26 in a row of RRAM cells 24 may be summed to provide an aggregated output signal, which is representative of a bit count of the exclusive NOR operations performed at each RRAM cell 24 in the row. Analog-to-digital converter (ADC) circuitry (not shown) may digitize the aggregated output signal to generate a digital number that is the bit count of the exclusive NOR operations for a given number of RRAM cells 24. Since the bit count operation does not require knowledge of the location of the high bits, it can be performed without individual addressing of the RRAM units 12, which allows for the simultaneous readout of an arbitrary number of RRAM cells 24.

In some embodiments, one comparator 26 may be shared between multiple RRAM cells 24. For example, each row of RRAM cells 24 as shown in FIG. 1 may share a single comparator 26. In such an embodiment, the compare signal CMP provided to the first input 34A of the comparator 26 is an aggregated compare signal CMP from multiple RRAM cells 24. The reference signal REF is set in order to determine the number of high and low currents that are summed at the bit line 22 in such an embodiment, such that the output signal OUT of the comparator 26 is a bit count of the exclusive NOR operations performed by the RRAM cells 24.

Figure 3:
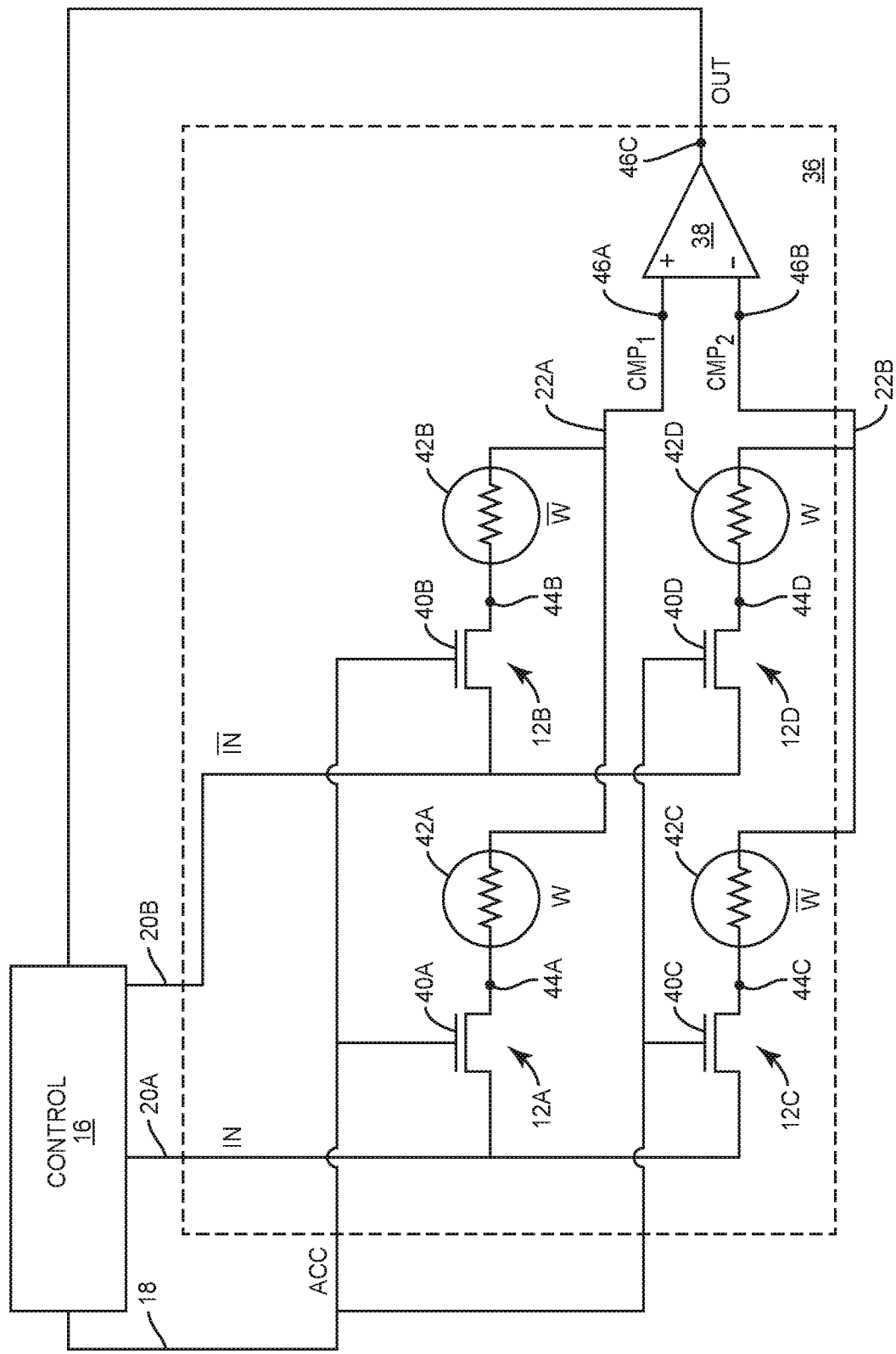
FIG. 3 illustrates an RRAM cell according to on embodiment of the present disclosure.

In some situations, it may be undesirable for the memory control circuitry 16 to generate the reference signal REF, as this may complicate the memory control circuitry 16. Accordingly, FIG. 3 shows an RRAM cell 36 according to an additional embodiment of the present disclosure. The RRAM cell 36 includes a first RRAM unit 12A, a second RRAM unit 12B, a third RRAM unit 12C, a fourth RRAM unit 12D, and a comparator 38 coupled between a word line 18, a first select line 20A, a second select line 20B, a first bit line 22A, and a second bit line 22B. The memory control circuitry 16 is shown for context. The first RRAM unit 12A includes a first switching device 40A coupled in series with a first resistive memory device 42A between the first select line 20A and the first bit line 22A. The first switching device 40A is shown as a transistor including a control input coupled to the word line 18, a first switching input coupled to the first select line 20A, and a second switching input coupled to a first access node 44A, which is in turn coupled to the first resistive memory device 42A. The second RRAM unit 12B includes a second switching device 40B coupled in series with a second resistive memory device 42B between the second select line 20B and the first bit line 22A. The second switching device 40B is shown as a transistor including a control input coupled to the word line 18, a first switching input coupled to the second select line 20B, and a second switching input coupled to a second access node 44B, which is in turn coupled to the second resistive memory device 42B. The third RRAM unit 12C includes a third switching device 40C coupled in series with a third resistive memory device 42C between the first select line 20A and the second bit line 22B. The third switching device 40C is shown as a transistor including a control input coupled to the word line 18, a first switching input coupled to the first select line 20A, and a second switching input coupled to a third access node 44C, which is in turn coupled to the third resistive memory device 42C. The fourth RRAM unit 12D includes a fourth switching device 40D coupled in series with a fourth resistive memory device 42D between the second select line 20B and the second bit line 22B. The fourth switching device 40D is shown as a transistor including a control input coupled to the word line 18, a first switching input coupled to the second select line 20B, and a second switching input coupled to a fourth access node 44D, which is in turn coupled to the fourth resistive memory device 42D. The comparator 38 forms a portion of the comparator circuitry 14 and includes a first input 46A coupled to the first bit line 22A, a second input 46B coupled to the second bit line 22B, and an output 46C coupled to the memory control circuitry 16.

The RRAM cell 36 is configured to perform an XNOR operation between a binary input value and a binary weight value. The result of the XNOR operation across multiple RRAM cells 36 may be aggregated with a bit count operation such that a plurality of RRAM cells 36 can be simultaneously read. In operation, the memory control circuitry 16 performs a write operation by setting a resistance of the first resistive memory device 42A and the fourth resistive memory device 42D to represent a binary weight value (the resistance representing the binary weight value is illustrated as W). As discussed above, in one embodiment, a binary high state (e.g., "1") is represented as a low resistance and a binary low state (e.g., "0," or "−1") is represented as a high resistance. The memory control circuitry 16 further sets a resistance of the second resistive memory device 42B and the third resistive memory device 42C to represent a complement of the binary weight value (the resistance representing the complement of the binary weight value is illustrated as W). For example, if the binary weight value is a binary high state, the resistance of the first resistive memory device 42A and the fourth resistive memory device 42D will be set to a low resistance while the resistance of the second resistive memory device 42B and the third resistive memory device 42C will be set to a high resistance. Those skilled in the art will appreciate that resistive memory devices are capable of storing values by changing a resistance thereof between a high resistance value and a low resistance value, and that the particular magnitude of the high resistance and the low resistance as referred to herein depends on the particular design of the resistive memory device. As discussed herein, the high resistance is a resistance that is measurably higher than the low resistance, and in some embodiments the high resistance is at least an order of magnitude larger than the low resistance. For purposes of discussion, it can be assumed that the low resistance state is 0Ω and the high resistance state is ∞Ω.

The memory control circuitry 16 performs a read operation by providing a signal representative of a binary input value (the signal representative of the binary input value is illustrated as IN) to the first select line 20A and providing a signal representative of a complement of the binary input value (the signal representative of the complement of the binary input value is illustrated as IN) to the second select line 20B. For purposes of discussion herein, a binary high state may be represented by a positive voltage (e.g., 2V) while a binary low state may be represented by a zero voltage. Those skilled in the art will appreciate that the particular voltage and or current levels for representing binary values may be changed without departing from the principles of the present disclosure. The memory control circuitry further provides an access signal ACC at the word line 18. As discussed herein, the access signal ACC is a signal that causes the first switching device 40A to couple (i.e., provide a low resistance path) the first select line 20A to the first access node 44A, the second switching device 40B to couple the second select line 20B to the second access node 44B, the third switching device 40C to couple the first select line 20A to the third access node 44C, and the fourth switching device 40D to couple the second select line 20B to the fourth access node 44D. When an access signal ACC is not provided the word line 18 is generally kept at a zero voltage (or a voltage below a threshold voltage of the switching devices 40), causing the first switching device 40A to decouple (i.e., provide a high resistance path) the first select line 20A from the first access node 44A, the second switching device 40B to decouple the second select line 20B from the second access node 44B, the third switching device 40C to decouple the first select line 20A from the third access node 44C, and the fourth switching device 40D to decouple the second select line 20B from the fourth access node 44D.

When the memory control circuitry 16 performs the read operation as discussed above, a current is produced through the first resistive memory device 42A and the second resistive memory device 42B at the first bit line 22A and a current is produced through the third resistive memory device 42C and the fourth resistive memory device 42D at the second bit line 22B. The current through the first resistive memory device 42A is determined by the voltage of the signal representative of the binary input value IN provided at the first select line 20A and the resistance representative of the binary weight value W at which the first resistive memory device 42A is set. The current through the second resistive memory device 42B is determined by the voltage of the signal representative of the complement of the binary input value IN provided at the second select line 20B and the resistance representative of the complement of the binary weight value W at which the second resistive memory device 42B is set. The current through the third resistive memory device 42C is determined by the voltage of the signal representative of the binary input value IN provided at the first select line 20A and the resistance representative of the complement of the binary weight value W at which the third resistive memory device 42C is set. The current through the fourth resistive memory device 42D is determined by the voltage of the signal representative of the complement of the binary input value IN provided at the second select line 20B and the resistance representative of the binary weight value W at which the fourth resistive memory device 42D is set. The combined current through the first resistive memory device 42A and the second resistive memory device 42B is provided as a first compare signal $CMP_1$ to the first input 46A of the comparator 38. The combined current of the third resistive memory device 42C and the fourth resistive memory device 42D is provided as a second compare signal $CMP_2$ to the second input 46B of the comparator 38. The comparator 38 compares the first compare signal $CMP_1$ to the second compare signal $CMP_2$ to provide an output signal OUT, wherein the output signal is representative of a binary high state when the first compare signal $CMP_1$ is greater than the second compare signal $CMP_2$ and the output signal OUT is representative of a binary low state when the second compare signal $CMP_2$ is greater than the first compare signal $CMP_1$. Accordingly, a binary value of the output signal OUT is equal to an exclusive NOR of the binary weight value and the binary input value.

As an example, when the binary input value and the binary weight value are both binary high states, the first resistive memory device 42A and the fourth resistive memory device 42D have a low resistance while the second resistive memory device 42B and the third resistive memory device 42C have a high resistance. Further, the signal representative of the binary input value IN at the first select line 20A is a positive voltage while the signal representative of the complement of the binary input value IN at the second select line 20B is a zero voltage. Accordingly, a large current is produced through the first resistive memory device 42A, a zero or negligible current is produced through the second resistive memory device 42B, a small current is produced through the third resistive memory device 42C, and a zero or negligible current is produced through the fourth resistive memory device 42D. The resulting first compare signal $CMP_1$ is a large current approximately equal to the current through the first resistive memory device 42A, and the resulting second compare signal $CMP_2$ is a small current approximately equal to the current through the third resistive memory device 42C. Since the first compare signal $CMP_1$ is significantly larger than the second compare signal $CMP_2$, the comparator 38 provides the output signal OUT as a signal representative of a binary high state. Those skilled in the art will readily understand that the particular magnitude of the large current and the small current are dependent on the resistance of the resistive memory elements 30 as well as the level of the signals used to represent a binary high state in the memory system. In general, the large current is measurably larger than the small current, and in some embodiments the large current is at least an order of magnitude larger than the small current.

As an additional example, when the binary input value is a binary high state and the binary weight value is a binary low state, the first resistive memory device 42A and the fourth resistive memory device 42D have a high resistance while the second resistive memory device 42B and the third resistive memory device 42C have a low resistance. Further, the signal representative of the binary input value IN at the first select line 20A is a positive voltage while the signal representative of the complement of the binary input value IN at the second select line 20B is a zero voltage. Accordingly, a small current is produced through the first resistive memory device 42A, a zero or negligible current is produced through the second resistive memory device 42B, a large current is produced through the third resistive memory device 42C, and a zero or negligible current is produced through the fourth resistive memory device 42D. The resulting first compare signal $CMP_1$ is a small current approximately equal to the current through the first resistive memory device 42A, and the resulting second compare signal $CMP_2$ is a large current approximately equal to the current through the third resistive memory device 42C.

Since the second compare signal $CMP_2$ is significantly larger than the first compare signal $CMP_1$, the comparator 38 provides the output signal OUT as a signal representative of a binary low state.

Those skilled in the art will readily appreciate that when the binary input value is a binary low state and the binary weight value is a binary high state, the output signal OUT will be representative of a binary low state, and when the binary input value is a binary low state and the binary weight value is a binary low state, the output signal OUT will be representative of a binary high state. Accordingly, the RRAM cell 36 is configured to perform an XNOR operation between the binary input value and the binary weight value.

As discussed above, an RRAM cell 36 may be arranged in an array with one or more other RRAM cells 36, wherein each RRAM cell 36 includes four adjacent RRAM units 12 as illustrated in FIG. 1 and a comparator 38. The output signal OUT from every comparator 38 in a row of RRAM cells 36 may be summed to provide an aggregated output signal, which is representative of a bit count of the exclusive NOR operations performed at each RRAM cell 36. ADC circuitry (not shown) may digitize the aggregated output signal to generate a digital number that is the bit count of the exclusive NOR operations for a given number of RRAM cells 36. Since the bit count operation does not require knowledge of the location of the high bits, it can be performed without individual addressing of the RRAM units 12, which allows for the simultaneous readout of an arbitrary number of RRAM cells 36.

Those skilled in the art will recognize improvements and modifications to the preferred embodiments of the present disclosure. All such improvements and modifications are considered within the scope of the concepts disclosed herein and the claims that follow.

What is claimed is:

1. A resistive random-access memory (RRAM) system, comprising:
   a plurality of RRAM cells, each RRAM cell comprising:
      at least two resistive memory elements coupled to a first bit line; and
      at least two additional resistive memory elements coupled to a second bit line;
   comparator circuitry coupled to the first bit line and the second bit line of each of the plurality of RRAM cells, wherein;
      the comparator circuitry is configured to compare a first compare signal corresponding to the at least two resistive memory elements with a second compare signal corresponding to the at least two additional resistive memory elements; and
      the comparator circuitry is configured to provide a bit count of operations performed by the plurality of RRAM cells; and
   memory control circuitry configured to perform a simultaneous read operation of the plurality of RRAM cells, wherein the memory control circuitry is further configured to set a resistance of one of the at least two resistive memory elements such that a binary high state is represented as a low resistance and a binary low state is represented as a high resistance.

2. The RRAM system of claim 1, wherein each of the plurality of RRAM cells further comprises:
   a word line;
   at least two select lines; and
   at least four switches.

3. The RRAM system of claim 2, wherein:
   the at least four switches are transistors;
   a gate of each transistor is coupled to the word line;
   each transistor is coupled to a respective select line; and
   each transistor is coupled to a respective resistive memory element.

4. The RRAM system of claim 1, wherein the comparator circuitry comprises a comparator having a first input coupled to the first bit line and a second input coupled to the second bit line.

5. The RRAM system of claim 1, wherein:
   the at least two resistive memory elements comprise a first resistive memory element and a second resistive memory element;
   the at least two additional resistive memory elements comprise a third resistive memory element and a fourth resistive memory element; and
   the memory control circuitry is further configured to:
      set a resistance of the first resistive memory element and the fourth resistive memory element to represent a binary weight value; and
      set a resistance of the second resistive memory element and the third resistive memory element to represent a complement of the binary weight value.

6. The RRAM system of claim 5, wherein:
   the memory control circuitry is further configured to:
      provide a signal representative of a binary input value to the first resistive memory element and the third resistive memory element; and
      provide a signal representative of a complement of the binary input value to the second resistive memory element and the fourth resistive memory element; and
   the comparator circuitry comprises a comparator having a first input coupled to the first bit line and a second input coupled to the second bit line and an output configured to provide an output signal representative of a binary value that is equal to an exclusive NOR of the binary weight value and the binary input value.

7. The RRAM system of claim 6, wherein the memory control circuitry is further configured to provide the signal representative of the binary input value and the signal representative of the complement of the binary input value such that the binary high state is represented as a positive voltage and the binary low state is represented as a zero voltage.

8. The RRAM of claim 1, wherein the memory control circuitry is further configured to perform the simultaneous read operation of the plurality of RRAM cells by causing the comparator circuitry to aggregate output signals from the plurality of RRAM cells.

9. The RRAM system of claim 1, wherein an output the comparator circuitry is coupled to the memory control circuitry.

10. A resistive random-access memory (RRAM) system, comprising:
   a plurality of RRAM cells, each RRAM cell comprising:
      at least two resistive memory elements coupled to a first bit line; and
      at least two additional resistive memory elements coupled to a second bit line;
   memory control circuitry configured to:
      set a resistance of one of the at least two resistive memory elements to represent a binary weight value;
      set a resistance of one of the at least two additional resistive memory elements to represent a complement of the binary weight value;

provide a signal representative of a binary input value to an input of one of the at least two resistive memory elements;

provide a signal representative of a complement of the binary input value to an input of one of the at least two additional resistive memory elements;

perform a simultaneous read operation of the plurality of RRAM cells;

provide a bit count of operations performed by the plurality of RRAM cells;

set the resistance of the one of the at least two resistive memory elements and the one of the at least two additional resistive memory elements such that a binary high state is represented as a low resistance and a binary low state is represented as a high resistance; and provide the signal representative of the binary input value and the signal representative of the complement of the binary input value such that the binary high state is represented as a positive voltage and the binary low state is represented as a zero voltage; and comparator circuitry coupled to the first bit line and the second bit line of each of the plurality of RRAM cells, wherein:

the comparator circuitry comprises a comparator having a first input coupled to the first bit line and a second input coupled to the second bit line of one of the plurality of RRAM cells and an output configured to provide an output signal representative of a binary value that is equal to an exclusive NOR of the binary weight value and the binary input value; and the comparator circuitry compares a first compare signal corresponding to the at least two resistive memory elements with a second compare signal corresponding to the at least two additional resistive memory elements.

11. The RRAM system of claim 10, wherein an output the comparator circuitry is coupled to the memory control circuitry.

12. The RRAM system of claim 10, wherein each of the plurality of RRAM cells further comprises:

a word line;

at least two select lines; and at least four switches.

13. The RRAM system of claim 12, wherein the at least four switches are transistors.

14. The RRAM system of claim 13, wherein:

a gate of each transistor is coupled to a word line;

each transistor is coupled to a respective select line; and each transistor is coupled to a respective resistive memory element.

* * * * *